United States Patent
Yawata et al.

(10) Patent No.: US 10,195,841 B2
(45) Date of Patent: Feb. 5, 2019

(54) METHOD FOR PRODUCING CYLINDRICAL RELIEF PRINTING ORIGINAL PLATE

(71) Applicant: TOYOBO CO., LTD., Osaka-shi, Osaka (JP)

(72) Inventors: Yukimi Yawata, Okayama (JP); Toru Wada, Okayama (JP)

(73) Assignee: TOYOBO CO., LTD., Osaka-shi (JP)

( * ) Notice: Subject to any disclaimer, the term of this patent is extended or adjusted under 35 U.S.C. 154(b) by 322 days.

(21) Appl. No.: 15/032,952

(22) PCT Filed: Oct. 28, 2014

(86) PCT No.: PCT/JP2014/078642
§ 371 (c)(1),
(2) Date: Apr. 28, 2016

(87) PCT Pub. No.: WO2015/064579
PCT Pub. Date: May 7, 2015

(65) Prior Publication Data
US 2016/0250840 A1    Sep. 1, 2016

(30) Foreign Application Priority Data
Oct. 29, 2013   (JP) ................................ 2013-224196

(51) Int. Cl.
| | | |
|---|---|---|
| *B41C 1/18* | (2006.01) | |
| *B41C 1/00* | (2006.01) | |
| *B41C 1/05* | (2006.01) | |
| *B41N 1/12* | (2006.01) | |
| *B41N 1/22* | (2006.01) | |
| *B29C 65/00* | (2006.01) | |
| *G03F 7/24* | (2006.01) | |
| *B29L 31/00* | (2006.01) | |

(52) U.S. Cl.
CPC ............ *B41C 1/006* (2013.01); *B29C 65/002* (2013.01); *B41C 1/05* (2013.01); *B41C 1/18* (2013.01); *B41N 1/12* (2013.01); *B41N 1/22* (2013.01); *G03F 7/24* (2013.01); *B29L 2031/767* (2013.01)

(58) Field of Classification Search
CPC .............. B29C 66/431; B29C 66/4312; B29C 66/1122; B29C 66/4322; B29C 66/49; B29C 66/496; B29C 66/73752; G03F 7/2055; G03F 1/06; G03F 1/92; B41C 1/182
USPC ........................................................ 156/187
See application file for complete search history.

(56) References Cited

U.S. PATENT DOCUMENTS

| | | | | |
|---|---|---|---|---|
| 4,758,500 A | * | 7/1988 | Schober .................. | B41N 6/02 156/215 |
| 4,883,742 A | | 11/1989 | Wallbillich et al. | |
| 6,132,950 A | * | 10/2000 | Ishigaki ............. | G03C 1/49863 430/619 |
| 8,066,837 B2 | * | 11/2011 | Stebani ..................... | G03F 7/18 156/187 |
| 2006/0249239 A1 | | 11/2006 | Krauss et al. | |

FOREIGN PATENT DOCUMENTS

| | | |
|---|---|---|
| EP | 1 800 187 A1 | 6/2007 |
| EP | 2 026 132 A2 | 2/2009 |
| JP | 5-66560 A | 3/1993 |
| JP | 6-317903 A | 11/1994 |
| JP | 2846954 B2 | 1/1999 |
| JP | 2004-262077 A | 9/2004 |
| JP | 2009-298103 A | 12/2009 |
| JP | 2010-64451 A | 3/2010 |
| WO | 93/23252 A1 | 11/1993 |

OTHER PUBLICATIONS

Notification of Transmittal of Translation of the International Preliminary Report on Patentability (Form PCT/IB/338) issued in counterpart International Patent Application No. PCT/JP2014/078642 dated May 12, 2016 (Form PCT/IB/373 and Form PCT/ISA/237. (7 pages).
International Search Report dated Jan. 27, 2015, issued in counterpart International Application No. PCT/JP2014/078642 (2 pages).
Extended (supplementary) European Search Report dated Jun. 23, 2017, issued in counterpart European Application No. 14857206.8. (6 pages).

* cited by examiner

*Primary Examiner* — Scott W Dodds
(74) *Attorney, Agent, or Firm* — Westerman, Hattori, Daniels & Adrian, LLP

(57) ABSTRACT

A method includes (i) preparing a printing original plate sheet having an uncured photosensitive resin layer on a surface thereof, wherein compressive strength of the uncured photosensitive resin layer at 25° C. is 1.0 to 3.0 $kgf/cm^2$; (ii) mounting the printing original plate sheet around a cylindrical support in such a manner that a starting terminal of the mounting and an ending terminal of the mounting are overlapped; and (iii) applying pressure to the overlapped area of the starting terminal of the mounting and the ending terminal of the mounting at a temperature range of 10 to 40 ° C. so as to pressure-bond the overlapped area. The method may further include, after the step (iii), a step (iv) for photo-curing the uncured photosensitive resin layer and may further comprise, after the step (iv), a step (v) for grinding, abrading and/or machining the overlapped area.

5 Claims, No Drawings

METHOD FOR PRODUCING CYLINDRICAL RELIEF PRINTING ORIGINAL PLATE

TECHNICAL FIELD OF THE INVENTION

The present invention relates to a method for producing a cylindrical relief printing original plate.

BACKGROUND ART

In a printing field in recent years, the following methods have become to be adopted (instead of a method wherein a printing plate is mounted together with positioning onto a plate cylinder): a method wherein a printing plate is mounted onto a cylindrical support and put onto a plate cylinder; and a method wherein a cylindrical printing original plate is prepared by forming a pattern-formable resin layer on a cylindrical support and then a pattern is engraved on a surface thereof followed by putting onto a plate cylinder. In a printing method using such a cylindrical printing plate, time required for setup and for job change is short and a high-speed printing is possible whereby it has been receiving much attention.

In a cylindrical relief printing plate, a laser engraving method has become to be used in recent years. In the laser engraving method, laser beam is irradiated to a resin layer so as to decompose and remove the resin whereby an uneven pattern is formed on a surface of the printing plate. The laser engraving method is highly efficient because it is possible to process the steps from imaging to pattern formation on a cylinder. As to a material for the resin layer to be applied to the laser engraving method, there have been used a vulcanized rubber, a cured photosensitive resin produced by photo-curing of a photosensitive resin composition and a cured thermosetting resin produced by thermosetting of a thermosetting resin composition. There have been particularly many proposals for a method for producing a cylindrical printing original plate using a liquid photosensitive resin and a sheet-form photosensitive resin plate which have been widely used in the printing field.

The Patent Document 1 discloses a method for producing a seamless and continuous printing element by mounting a sheet-form printing original plate layer around a sleeve for printing and by bonding terminal areas thereof by means of dissolution or melting.

The Patent Document 2 discloses a method for producing a cylindrical printing original plate wherein a printing original plate layer sheet is mounted around a cylindrical support and an overlapped area of a starting terminal of the mounting and an ending terminal of the mounting is bonded by heating the overlapped area at 80° C. to 250° C. together with applying pressure thereto.

In the methods for producing a cylindrical printing original plate as being disclosed in Patent Documents 1 and 2, a cylindrical printing original plate is produced by bonding terminal areas of a sheet-form printing original plate by dissolving or melting them at high temperature. Accordingly, the production methods as such involve a thermochemical change of a printing original plate composition during the dissolution or melting process. In the cylindrical printing original plate produced as such, the bonded terminals are thermally deteriorated and joint strength between the starting terminal of the mounting and the ending terminal of the mounting is weak. Accordingly, when a laser engraving is applied thereto and a pattern is formed together with a high-speed revolution of the cylindrical printing original plate, the printing original plate is sometimes demounted from the support because of breaking of jointed area. In addition, there is also a problem in terms of production efficiency that toxic smell is generated due to evaporation of low-molecular ingredients of the printing original plate composition during bonding or that a stabilizing step such as cooling is necessary after the bonding.

PRIOR ART DOCUMENTS

Patent Documents

Patent Document 1: Japanese Patent No. 2846954
Patent Document 2: Japanese Patent Application Laid-Open (JP-A) No. 2010-64451

DISCLOSURE OF THE INVENTION

Problem That the Invention is to Solve

The present invention has been achieved for solving the problems as such in the prior art and its object is to provide a method for producing a cylindrical relief printing original plate by mounting a printing original plate sheet around a cylindrical support, which method can produce a cylindrical relief printing original plate having high joint strength in terminals thereof whereby the printing original plate is not demounted even when a laser engraving is applied thereto.

Means for Solving the Problem

In order to achieve such an object, the present inventors have performed eager investigations for a simple method which does not need any bonding step at high temperature during joint process of both terminals of a printing original plate sheet and, as a result, they have found that joint strength of the overlapped area is significantly improved by preparing a printing original plate sheet having a photosensitive resin layer on a surface thereof, wherein compressive strength of the photosensitive resin layer at 25° C. is 1.0 to 3.0 kgf/cm$^2$; by mounting the printing original plate sheet around a cylindrical support in such a manner that a starting terminal of the mounting and an ending terminal of the mounting are overlapped; and by pressure-bonding the overlapped area while applying pressure to the overlapped area at ordinary room temperature range. The present inventors also have found that, in the cylindrical printing original plate produced as such, unevenness in thickness is little, joint strength can be maintained even in a high-speed printing and there is no disadvantage of uneven printing. The present inventors have further found that such a method is excellent in terms of environment for production operation.

The present invention has been accomplished on the basis of the above findings and has the constitution of the following (1) to (5).

(1) A method for producing a cylindrical relief printing original plate by mounting a printing original plate sheet around a cylindrical support, characterized in that the method comprises the following steps (i) to (iii):

(i) a step for preparing a printing original plate sheet having an uncured photosensitive resin layer on a surface thereof, wherein compressive strength of the uncured photosensitive resin layer at 25° C. is 1.0 to 3.0 kgf/cm$^2$;

(ii) a step for mounting the printing original plate sheet around a cylindrical support in such a manner that a starting terminal of the mounting and an ending terminal of the mounting are overlapped; and (iii) a step for applying pressure to the overlapped area of the starting terminal of the mounting and the ending terminal of the mounting at a temperature range of 10 to 40° C. so as to pressure-bond the overlapped area.

(2) The method according to (1), wherein content of a binder polymer in the photosensitive resin layer is 35 to 55% by mass.

(3) The method according to (2), wherein the binder polymer in the photosensitive resin layer contains at least one kind of latex resin selected from polybutadiene latex, nitrile-butadiene latex, styrene-butadiene latex and methyl methacrylate-butadiene latex.

(4) The method according to any of (1) to (3), wherein, after the step (iii), the method further comprises a step (iv) for photo-curing the uncured photosensitive resin layer.

(5) The method according to (4), wherein, after the step (iv), the method further comprises a step (v) for grinding, abrading and/or machining the overlapped area.

Advantages of the Invention

In accordance with a production method of the present invention, it is possible to efficiently produce a cylindrical printing original plate for laser engraving wherein joint strength between both terminals of a printing original plate sheet mounted around a cylindrical support, is high and wherein unevenness in thickness is small. In addition, since no treatment at high temperature is needed for joint formation, burden in production method and in equipments is small and the environment for production operation is excellent.

DETAILED DESCRIPTION OF THE INVENTION

As hereunder, the method for producing a cylindrical relief printing original plate in accordance with the present invention will be illustrated in detail.

The method of the present invention is characterized in comprising the following steps (i) to (iii):

(i) a step for preparing a printing original plate sheet having an uncured photosensitive resin layer on a surface thereof, wherein compressive strength of the uncured photosensitive resin layer at 25° C. is 1.0 to 3.0 kgf/cm$^2$;

(ii) a step for mounting the printing original plate sheet around a cylindrical support in such a manner that a starting terminal of the mounting and an ending terminal of the mounting are overlapped; and (iii) a step for applying pressure to the overlapped area of the starting terminal of the mounting and the ending terminal of the mounting at a temperature range of 10 to 40° C. so as to pressure-bond the overlapped area.

In the step (i), a printing original plate sheet having an uncured photosensitive resin layer can be prepared using any publicly known method. The uncured photosensitive resin layer may be either an uncured photosensitive resin layer itself or a laminate of an uncured photosensitive layer on a support film. The present invention is characterized in that compressive strength at 25° C. of the photosensitive resin layer used here is 1.0 to 3.0 kgf/cm$^2$ and preferably 1.5 to 2.5 kgf/cm$^2$. The conventional photosensitive resin layer has compressive strength which is far higher than the above range. Accordingly, it is not possible to achieve sufficient joint at 10° C. to 40° C. with the conventional photosensitive resin layer. When the compressive strength is within the above range, the resin does not flow at 10° C. to 40° C. but can retain its shape. In addition, both terminals of the resin layer being mounted around a cylindrical support can be surely joined only by applying pressure at ordinary room temperature range of 10° C. to 40° C.

Examples of the cylindrical support used in the present invention are a cylinder made of metal, rubber or plastics and a sleeve made of plastics, metal or fiber-reinforced plastics. In view of handling and weight, a hollow cylindrical support made of fiber-reinforced plastics is particularly preferred.

In order to achieve the above compressive strength in the photosensitive resin layer of the present invention, it is preferred that content of a binder polymer in the photosensitive resin layer is 35 to 55% by mass. When the content of the binder polymer is within the above range, the resin does not flow at 10° C. to 40° C. but can retain its shape. In addition, the photosensitive resin layer after curing can exhibit toughness and rubber elasticity suitable for printing.

Besides the above binder polymer, the photosensitive resin layer may further contain publicly known photopolymerizable compound and photopolymerization initiator. If desired, it is also possible to add, for example, polymerization inhibitor, ultraviolet absorber, photothermal converting agent, highly thermal conductor, porous inorganic particles, lubricant, surfactant, plasticizer, fragrance, etc. thereto. The binder polymer acts as a binder for connecting those materials.

In order to achieve the above compressive strength in the photosensitive resin layer of the present invention, it is preferred that the binder polymer contains, as a main ingredient (40% by mass or more), at least one kind of latex resin selected from polybutadiene latex (BR latex), nitrile-butadiene latex (NBR latex), styrene-butadiene latex (SBR latex) and methyl methacrylate-butadiene latex (MBR latex). Since the latex resin as such is synthetic rubber in fine particles, it has such a characteristic that, although it is tough, it also has fluidity. Accordingly, the latex resin as such is suitable for achieving the above compressive strength.

As to a method for preparing the printing original plate sheet by forming the photosensitive resin layer into a sheet form, any publicly known method for forming resin may be used. For example, the photosensitive resin layer may be sandwiched by a support film and a protective film and may be pressurized using a heat press machine or the like. The pressurizing condition is preferred to be about 20 to 200 kg/cm$^2$ and the temperature condition during pressurization is preferred to be from room temperature to about 150° C. Although there is no particular limitation for thickness of the formed product formed thereby, it is usually about 0.1 to 10 cm.

As to the support film, it is preferred to use a material being excellent in dimensional stability. There may be used a polyester film such as PET (polyethylene terephthalate), PBT (polybutylene terephthalate) or PAN (polyacrylonitrile) and a polyolefin film such as PE (polyethylene) or PP (polypropylene). Thickness of the support film is preferred to be 25 to 500 μm and more preferred to be 50 to 250 μm.

The protective film is provided for preventing scratches or dents on a surface of the photosensitive resin layer. There may be used a polyester film such as PET (polyethylene terephthalate), PBT (polybutylene terephthalate) or PAN (polyacrylonitrile) and a polyolefin film such as PE (polyethylene) or PP (polypropylene). Thickness of the protective film is preferred to be 25 to 500 μm and more preferred to be 50 to 250 μm. In addition, surfaces of the protective film may be made into mat.

It is preferred that the protective film is releasable from the photosensitive resin layer. An adhesion preventive layer may be formed between them. A material used for the adhesion preventive layer is preferred to have a resin exhibiting little adhesive property as an ingredient such as polyvinyl alcohol, polyvinyl acetate, partially saponified polyvinyl alcohol, hydroxyalkyl cellulose, alkyl cellulose and polyamide resin. Alternatively, a releasing layer of a long-chain alkyl type or a silicone type may be formed between them for adjusting the release.

When the printing original plate sheet is mounted around a sleeve while remaining the support film, it is better to form an adhesive layer between the support film and the photosensitive resin layer. When the support film is released and then the printing original plate sheet is mounted around the sleeve, it is preferred for facilitating the releasing operation that the above releasing layer is formed on the surface of the support film contacting the photosensitive resin layer.

In the step (ii), the printing original plate sheet prepared in the step (i) is mounted around a cylindrical support in such a manner that a starting terminal of the mounting and an ending terminal of the mounting are overlapped. Width of the overlapped area of the printing original plate sheet is preferred to be 1 mm to 50 mm, more preferred to be 2 mm to 10 mm, and further preferred to be 3 mm to 5 mm. When the width of the overlapped area is within the above range, no excessive overlapped area exists and joint strength of the joined area can be sufficiently secured.

When the sheet-form printing original plate has the support film, mounting is performed in such a manner that the side of the support film contacts the cylindrical support. At that time, it is preferred for preventing occurrence of uneven thickness that the support film in the overlapped area of the starting terminal and/or the ending terminal is removed and mounted around the cylindrical support. On the surface of the cylindrical support, an adhesive layer or a tackifier layer may be formed.

In the step (iii), pressure is applied at a temperature range of 10 to 40° C., preferably 15 to 30° C., to the overlapped area of the starting terminal of the mounting and the ending terminal of the mounting (upon mounting of the printing original plate sheet, around the cylindrical support) so as to pressure-bond the overlapped area whereby a strong joined area is formed. Since the joint is formed by application of pressure at the ordinary room temperature range of 10 to 40° C. in accordance with the method of the present invention, there is no thermochemical deterioration due to melting of the resin at all and joint strength between both terminal areas is very high. Usually, pressure to be applied to the overlapped area during pressure-bonding is 0.05 to 20 kgf/cm$^2$ and preferably 1 to 8 kgf/cm$^2$.

As to a method for pressure-bonding the overlapped area of the starting terminal of the mounting and the ending terminal of the mounting in the step (iii), there may be used any publicly known method. For example, the pressure-bonding may be performed using metal roll, metal block or a flexible sheet made of metal or resin. When the metal block is used, the surface to be pressure-bonded may be flat or curved. When the flexible sheet made of metal or resin is used, it is possible to make into a surface having no unevenness by such a means that the flexible sheet is covered on the overlapped area, pressure is then applied thereto and the resulting curve is retained.

After the step (iii), there is per formed a step (iv) for photo-curing the uncured photosensitive resin layer so as to be subjected to the actual printing.

After the step (iv), it is preferred to perform a physical treatment for making the surface smooth so as to enhance the thickness precision of the overlapped area. To be more specific, it is preferred to perform a step (v) for grinding, abrading and/or machining the overlapped area. When the surface shape is rough, it is preferred to perform the grinding followed by performing the machining so as to make the surface shape smooth. The grinding may be performed with a belt or whetstone. The abrading may be performed by a commercially available abrading machine such as a grinder. After the step (v), a pattern, formation is done on the surface of the cylindrical printing original plate using a laser engraving machine as publicly known. Then, a relief printing is carried out as publicly known.

EXAMPLES

The present invention will now be illustrated in more detail as hereunder by Examples although the present invention is not limited to the following Examples.

Example 1

Step (i)
According to the composition (ratio by mass) described in Table 1, binder polymer, plasticizer, cross-linking agent and additive were mixed in a container and then kneaded using a pressure kneader of 80° C. to give a photosensitive resin composition.

The resulting photosensitive resin composition was sandwiched between a support film (a PET film of 125 μm thickness coated with a polyester adhesive) and a protective film (a PET film of 125 μm thickness coated with a polyvinyl alcohol adhesion preventive agent) and pressurized at 105° C. for 1 minute using a heat press to give a printing original plate sheet of 1.7 mm thickness. Each of 0.5 mm of upper surface of the starting terminal of the mounting and 0.5 mm of lower surface of the ending terminal of the mounting was removed to an extent of 5 mm width using a cutter.

Step (ii)
A cylindrical support (inner diameter: 300 mm) made of plastics reinforced with glass fiber was mounted to an air cylinder. An anaerobic adhesive (manufactured by Three-Bond; trade name: TB-1530) was applied on surface of the support with 0.1 mm thickness followed by being allowed to stand for 10 minutes. The printing original plate sheet wherefrom the protective sheet was released was mounted thereon in such a manner that a starting terminal of the mounting and an ending terminal of the mounting were overlapped. Width of the overlapped area was 5 mm.

Step (iii)
A metal block warmed by being kept for 1 hour in a constant-temperature machine set at. the temperature as shown in Table 1 was pushed onto the overlapped area so that both terminals were pressure-bonded. Pressure applied was 5 kgf/cm$^2$.

Step (iv)
The uncured cylindrical printing original plate was exposed to light using a cylindrical exposing machine (RE-300 manufactured by Takano Seisakusho) for 20 minutes so as to perform photo-curing.

Step (v)
The overlapped area was subjected to grinding, abrading and/or machining so as to make surface thereof smooth.

Laser Engraving
Pattern was formed on surface of the above-prepared cylindrical printing original plate with a laser output of 500 W using a carbon dioxide laser engraving machine (HE-RIOS 6010 manufactured by Stork Prints). The engraved depth was 0.4 mm. During the laser engraving, the air cylinder was subjected to a high-speed revolution at 11 m/minute but the printing original plate sheet was not demounted from the cylindrical support.

The engraved cylindrical printing original plate was washed with a 1% aqueous solution of detergent soap for 5 minutes using a hand brush. Water on the plate surface was removed followed by drying at 60° C. for 10 minutes.

Printing

The resulting cylindrical printing plate was subjected to printing at the rate of 50 m/minute using a flexographic printer FPR 302 (manufactured by MCK).

Compressive Strength of Photosensitive Resin Composition

The resulting photosensitive resin composition was sandwiched between a support film (a PET film of 125 μm thickness coated with a polyester adhesive) and a protective film (a PET film of 125 μm thickness coated with a polyvinyl alcohol adhesion preventive agent) and pressurized at 105° C. and with pressure of 100 kg/cm² for 1 minute using a heat press to give a printing sheet of 3.0 mm thickness. The protective film was released from the printing sheet. Compressive strength was calculated from the maximum load which was achieved when pushing a compressing rod of 1 cm diameter into the printing sheet to an extent of 100 μm depth from the surface layer.

Evaluation of Precision of Outer Diameter of Cylindrical Printing Original Plate Difference between thickness of the overlapped area obtained in the step (iii) and an average thickness of ten other areas was measured. When the difference was less than ±0.1 mm, ±0.1 mm to less than 0.2 mm and ±0.2 mm or more, it was evaluated as "○", "Δ" and "x ", respectively. Precision of outer diameter of the cylindrical printing original plate excluding the overlapped area was ±20 μm.

Evaluation of Mounting Property of Printing Original Plate Sheet During Printing When the printing original plate sheet was not released during printing, it was evaluated as "○" and, when any portion of the sheet was released, it was evaluated as "x ".

Examples 2 to 10 and Comparative Examples 1 to 4

In the same manner as in Example 1, there were performed the steps (i) to (v), the laser engraving, the printing and the evaluation in accordance with the description in Table 1.

Example 11

In the same manner as in Example 1, there were performed the steps (i) to (v), the laser engraving, the printing and the evaluation except that the support film used in Example 1 was changed to a PET film of 125 μm thickness coated with a silicone-type releasing layer and that the printing original plate sheet where from not only the protective film but also the support film were released was used for mounting.

Comparative Example 5

Step (i)

According to the composition (ratio by mass) described in Table 1, binder polymer, plasticizer, cross-linking agent and additive were mixed in a container and then kneaded using a pressure kneader of 80° C. to give a photosensitive resin composition. The resulting photosensitive resin composition exhibited high fluidity at ordinary room temperature range of 10 to 40° C. and thus could not be made into a definite shape.

TABLE 1

|  |  |  |  | Example 1 | Example 2 | Example 3 | Example 4 | Example 5 | Example 6 |
|---|---|---|---|---|---|---|---|---|---|
| Photosensitive resin layer composition | Binder polymer | BR latex | LX111NF (solid content) | 76(42) | 76(42) | 76(42) | 80(44) | 62(34) | 73(40) |
|  |  | NBR latex | SX1503 (solid content) | 19(8) | 19(8) | 19(8) | 19(8) | 14(6) |  |
|  |  | SBR latex | SR-110 (solid content) |  |  |  |  |  | 12(5) |
|  |  | MBR latex | MR-170 (solid content) |  |  |  |  |  |  |
|  |  | BR polymer | BR1220 |  |  |  | 3 |  |  |
|  |  | SBS polymer | D-KX2222 |  |  |  |  |  |  |
|  |  | SIS polymer | D-KX1161 |  |  |  |  |  |  |
|  | Plasticizer | Liquid polybutadiene | LBR352 | 10 | 10 | 10 | 6 | 10 | 10 |
|  |  |  | LIP-390 |  |  |  |  |  |  |
|  |  |  | Polyoil 130 |  |  |  |  |  |  |
|  |  | Paraffin | Smoil P350 |  |  |  |  |  |  |
|  | Cross-linking agent | Hydrophilic polymer | PFT-3 (solid content) | 20(5) | 20(5) | 20(5) | 28(7) | 36(9) | 20(5) |
|  |  | Cross-linkable oligomer | Oligobutadiene diacrylate | 19 | 19 | 19 | 16 | 25 | 24 |
|  |  | Cross-linkable monomer | Hexanediol diacrylate | 5 | 5 | 5 | 5 | 5 | 5 |
|  |  |  | Nonanediol diacrylate | 5 | 5 | 5 | 5 | 5 | 5 |
|  |  |  | Dimethylol heptane diacrylate | 5 | 5 | 5 | 5 | 5 | 5 |
|  | Additive | Photopolymerization initiator | Irgacure 653 | 1 | 1 | 1 | 1 | 1 | 1 |
| Compressive strength of photosensitive resin composition (kg/cm²) |  |  |  | 2.0 | 2.0 | 2.0 | 2.2 | 1.7 | 2.3 |
| Heating temperature during pressure-bonding of both terminals (step iii) |  |  |  | 25° C. | 20° C. | 30° C. | 25° C. | 25° C. | 25° C. |
| Evaluation | Precision of outer diameter of cylindrical printing original plate |  |  | ○ −0.06 | so +0.03 | ○ −0.09 | ○ −0.02 | ○ −0.08 | ○ +0.03 |
|  | Mounting property of printing original plate sheet during printing |  |  | ○ | ○ | ○ | ○ | ○ | ○ |

TABLE 1-continued

| | | | | Example 7 | Example 8 | Example 9 | Example 10 | Example 11 |
|---|---|---|---|---|---|---|---|---|
| Photosensitive resin layer composition | Binder polymer | BR latex | LX111NF (solid content) | 98(54) | 15(8) | 58(32) | | 76(42) |
| | | NBR latex | SX1503 (solid content) | | 98(42) | | 84(36) | 19(8) |
| | | SBR latex | SR-110 (solid content) | | | | | |
| | | MBR latex | MR-170 (solid content) | | | 42(18) | | |
| | | BR polymer | BR1220 | | | | | |
| | | SBS polymer | D-KX2222 | | | | | |
| | | SIS polymer | D-KX1161 | | | | | |
| | Plasticizer | Liquid polybutadiene | LBR352 | 10 | | | | 10 |
| | | | LIP-390 | | 14 | | | |
| | | | Polyoil 130 | | | | 13 | |
| | | Paraffin | Smoil P350 | | | 10 | | |
| | Cross-linking agent | Hydrophilic polymer | PFT-3 (solid content) | 20(5) | 20(5) | 20(5) | 40(10) | 20(5) |
| | | Cross-linkable oligomer | Oligobutadiene diacrylate | 15 | 15 | 19 | 25 | 19 |
| | | Cross-linkable monomer | Hexanediol diacrylate | 5 | 5 | 5 | 5 | 5 |
| | | | Nonanediol diacrylate | 5 | 5 | 5 | 5 | 5 |
| | | | Dimethylol heptane diacrylate | 5 | 5 | 5 | 5 | 5 |
| | Additive | Photopolymerization initiator | Irgacure 653 | 1 | 1 | 1 | 1 | 1 |
| Compressive strength of photosensitive resin composition (kg/cm$^2$) | | | | 2.5 | 2.2 | 2.4 | 1.6 | 2.0 |
| Heating temperature during pressure-bonding of both terminals (step iii) | | | | 25° C. | 25° C. | 25° C. | 25° C. | 25° C. |
| Evaluation | | | Precision of outer diameter of cylindrical printing original plate | ○ +0.06 | ○ +0.02 | ○ +0.06 | ○ −0.09 | ○ −0.09 |
| | | | Mounting property of printing original plate sheet during printing | ○ | ○ | ○ | ○ | ○ |

| | | | | Comparative Example 1 | Comparative Example 2 | Comparative Example 3 | Comparative Example 4 | Comparative Example 5 |
|---|---|---|---|---|---|---|---|---|
| Photosensitive resin layer composition | Binder polymer | BR latex | LX111NF (solid content) | | | | 91(50) | 15(8) |
| | | NBR latex | SX1503 (solid content) | | | | 23(10) | 19(8) |
| | | SBR latex | SR-110 (solid content) | | | 23(10) | | |
| | | MBR latex | MR-170 (solid content) | | | | | |
| | | BR polymer | BR1220 | | | | | |
| | | SBS polymer | D-KX2222 | 34 | 34 | 30 | | |
| | | SIS polymer | D-KX1161 | 34 | 34 | | | |
| | Plasticizer | Liquid polybutadiene | LBR352 | | | | 19 | 24 |
| | | | LIP-390 | | | 14 | | |
| | | | Polyoil 130 | 21 | 21 | | | |
| | | Paraffin | Smoil P350 | | | 10 | | 20 |
| | Cross-linking agent | Hydrophilic polymer | PFT-3 (solid content) | | | 20(5) | | 20(5) |
| | | Cross-linkable oligomer | Oligobutadiene diacrylate | | | 15 | 10 | 19 |
| | | Cross-linkable monomer | Hexanediol diacrylate | 10 | 10 | 5 | | 5 |
| | | | Nonanediol diacrylate | | | 5 | 5 | 5 |
| | | | Dimethylol heptane diacrylate | | | 5 | 5 | 5 |
| | Additive | Photopolymerization initiator | Irgacure 653 | 1 | 1 | 1 | 1 | 1 |
| Compressive strength of photosensitive resin composition (kg/cm$^2$) | | | | 8.5 | 8.5 | 4.5 | 3.2 | — |
| Heating temperature during pressure-bonding of both terminals (step iii) | | | | 25° C. | 200° C. | 25° C. | 25° C. | — |
| Evaluation | | | Precision of outer diameter of cylindrical printing original plate | x +0.22 | ○ −0.09 | Δ +0.19 | Δ +0.15 | — |
| | | | Mounting property of printing original plate sheet during printing | ○ | x | ○ | ○ | — |

As will be apparent from the result of Table 1, compressive strength of the photo-sensitive resin composition and pressure-bonding temperature of the overlapped area are within the ranges defined by the present invention in Examples 1 to 11. Accordingly, precision of outer diameter of the cylindrical printing original plate before the surface treatment step (v) is high, the surface treatment of the step (v) can be easily finished within short time and retaining property of the printing original plate sheet during printing is also high in Examples 1 to 11. On the contrary, in Comparative Examples 1 to 4, any of compressive strength of the photosensitive resin composition and pressure-bonding temperature of the overlapped area is out of the ranges defined by the present invention. Accordingly, any of the evaluating factors is inferior in Comparative Examples 1 to 4. In Comparative Example 5, the photosensitive resin composition exhibits high fluidity at ordinary room temperature as mentioned already whereby it was not possible to prepare a printing original plate sheet.

INDUSTRIAL APPLICABILITY

According to the production method of the present invention, it is possible to provide a cylindrical printing original plate achieving high thickness precision and high joint strength. Also, the production method of the present invention is excellent in terms of environment for production operation. Accordingly, the present invention is extremely useful.

The invention claimed is:

1. A method for producing a cylindrical relief printing original plate by mounting a printing original plate sheet around a cylindrical support, characterized in that the method comprises the following steps (i) to (iii):
   (i) a step for preparing a printing original plate sheet having an uncured photosensitive resin layer on a surface thereof, wherein compressive strength of the uncured photosensitive resin layer at 25° C. is 1.0 to 3.0 kgf/cm$^2$;
   (ii) a step for mounting the printing original plate sheet around a cylindrical support in such a manner that a starting terminal of the mounting and an ending terminal of the mounting are overlapped; and
   (iii) a step for applying pressure to the overlapped area of the starting terminal of the mounting and the ending terminal of the mounting at a temperature range of 10 to 40° C. so as to pressure-bond the overlapped area.

2. The method according to claim 1, wherein content of a binder polymer in the photosensitive resin layer is 35 to 55% by mass.

3. The method according to claim 2, wherein the binder polymer in the photosensitive resin layer contains at least one kind of latex resin selected from polybutadiene latex, nitrile-butadiene latex, styrene-butadiene latex and methyl methacrylate-butadiene latex.

4. The method according to claim 1, wherein, after the step (iii), the method further comprises a step (iv) for photo-curing the uncured photosensitive resin layer.

5. The method according to claim 4, wherein, after the step (iv), the method further comprises a step (v) for grinding, abrading and/or machining the overlapped area.

* * * * *